(12) United States Patent
Su et al.

(10) Patent No.: US 8,335,249 B1
(45) Date of Patent: Dec. 18, 2012

(54) RECEIVER EQUALIZER CIRCUITRY WITH OFFSET VOLTAGE COMPENSATION FOR USE ON INTEGRATED CIRCUITS

(75) Inventors: Xiaoyan Su, San Jose, CA (US); Sriram Narayan, Pleasanton, CA (US); Wilson Wong, San Francisco, CA (US); Sergey Shumarayev, Los Altos Hills, CA (US)

(73) Assignee: Altera Corporation, San Jose, CA (US)

( * ) Notice: Subject to any disclaimer, the term of this patent is extended or adjusted under 35 U.S.C. 154(b) by 466 days.

(21) Appl. No.: 12/626,379

(22) Filed: Nov. 25, 2009

(51) Int. Cl.
H03H 7/40 (2006.01)
(52) U.S. Cl. .................................................. 375/232
(58) Field of Classification Search .......... 375/229–230, 375/232, 350; 708/322–323; 330/304
See application file for complete search history.

(56) References Cited

U.S. PATENT DOCUMENTS

| | | | |
|---|---|---|---|
| 5,124,673 A * | 6/1992 | Hershberger | 333/18 |
| 7,034,608 B2 * | 4/2006 | Gai et al. | 330/9 |
| 7,254,173 B1 * | 8/2007 | Fu et al. | 375/233 |
| 7,598,811 B2 * | 10/2009 | Cao | 330/304 |
| 7,778,323 B1 * | 8/2010 | Nodenot et al. | 375/233 |
| 8,098,724 B2 * | 1/2012 | Shumarayev et al. | 375/233 |
| 2005/0002479 A1 * | 1/2005 | Tripathi et al. | 375/345 |
| 2006/0088086 A1 * | 4/2006 | Gondi et al. | 375/229 |
| 2007/0041455 A1 * | 2/2007 | Tran et al. | 375/257 |

OTHER PUBLICATIONS

Chen et al., "Electrical Backplane Equalization Using Programmable Analog Zeros and Folded Active Inductors," IEEE Transactions on Microwave Theory and Techniques, vol. 55, No. 7, Jul. 2007, pp. 1459-1466.

Chen et al., "Design of Low-Power Short-Distance Opto-Electronic Transceiver Front-Ends with Scalable Supply Voltages and Frequencies," ISLPED '08, Aug. 11-13, 2008, Bangalore, India.

Lee, "A 20-Gb/s Adaptive Equalizer in 0.13-μm CMOS Technology," IEEE Journal of Solid-State Circuits, vol. 41, No. 9. Sep. 2006, pp. 2058-2066.

You et al., "An 11 GHz FPGA with Test Applications," Field Programmable Logic and Applications, 2005 International Conference, Aug. 2005, pp. 101-105.

Guo et al., "Design and Implementation of Adaptive Equalizer Based on FPGA," The Eighth International Conference on Electronic Measurement and Instruments, ICEMI'2007, Aug. 2007, pp. 4-790-4-794.

* cited by examiner

Primary Examiner — Khanh C Tran
(74) Attorney, Agent, or Firm — Ropes & Gray LLP; Jeffrey H. Ingerman (57) ABSTRACT

Equalizer circuitry on an integrated circuit ("IC") includes first, second, and third continuous time, equalizer stages connected in series. Each stage includes peaking inductor circuitry. The equalizer circuitry may further include controllably variable, static, DC mode offset voltage compensation circuitry and/or dynamic, continuous mode, offset voltage compensation circuitry for respectively reducing DC voltage offset and/or time-varying, continuous mode voltage offset between an output of the third equalizer stage and utilization circuitry to which that output is applied. The first equalizer stage may be preceded by termination circuitry having controllably variable impedance. Differential circuitry and signalling may be used for various circuit components. The equalizer circuitry is particularly useful for fabrication as part of a programmable IC, using 28 nm CMOS technology, and as a receiver equalizer for a high-speed serial data signal having a bit rate of 20-25 Gbps.

32 Claims, 6 Drawing Sheets

RECEIVER EQUALIZER CIRCUITRY WITH OFFSET VOLTAGE COMPENSATION FOR USE ON INTEGRATED CIRCUITS

BACKGROUND

This invention relates to receiver equalizer circuitry, and more particularly to receiver equalizer circuitry having offset voltage compensation circuitry. The equalizer circuitry is intended for implementation on an integrated circuit ("IC"), especially an IC fabricated using, for example, 28 nm CMOS technology. The equalizer circuitry is further intended for use in receiving and equalizing (i.e., improving the quality of, and therefore the ability to recover data information from) a high-speed serial data signal. For example, the signal to be equalized may have a bit rate in the range of about 20-25 Gigabits-per-second ("Gbps").

SUMMARY

In accordance with certain possible aspects of the invention, equalizer circuitry on an IC may include first, second, and third continuous time, linear, equalizer stages connected in series with one another. Each of the equalizer stages preferably includes peaking inductor circuitry. The equalizer circuitry may further include controllably variable, static, DC mode offset voltage compensation circuitry for controllably reducing DC voltage offset between an output of the third equalizer stage and utilization circuitry (e.g., clock and data recovery ("CDR") circuitry) to which that output is applied. As an alternative or addition to the above static offset voltage compensation circuitry, the equalizer circuitry may include dynamic, continuous mode, DC offset voltage compensation circuitry for automatically reducing, on an on-going or continuous basis, DC voltage offset between the third stage output and the utilization circuitry.

In accordance with another possible aspect of the invention, the first equalizer stage may be preceded by termination circuitry having controllably variable impedance.

In accordance with still another possible aspect of the invention, differential circuitry and differential signalling may be used for various components of the equalizer circuitry.

Further features of the invention, its nature and various advantages will be more apparent from the accompanying drawings and the following detailed description.

DETAILED DESCRIPTION

Figure 1:
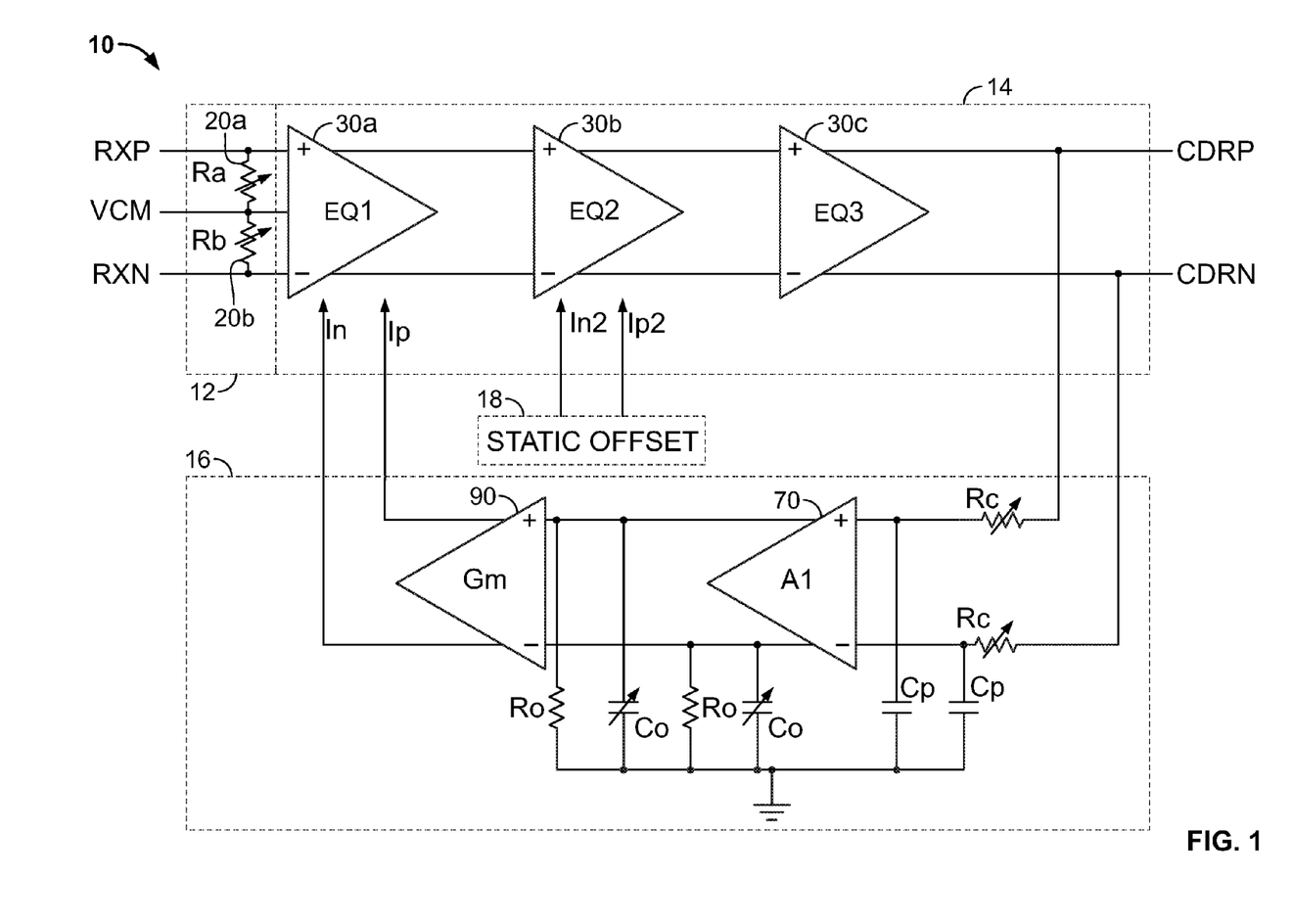
FIG. 1 is a simplified, schematic, block diagram of an illustrative embodiment of certain possible features in accordance with the invention.
Figure 2:
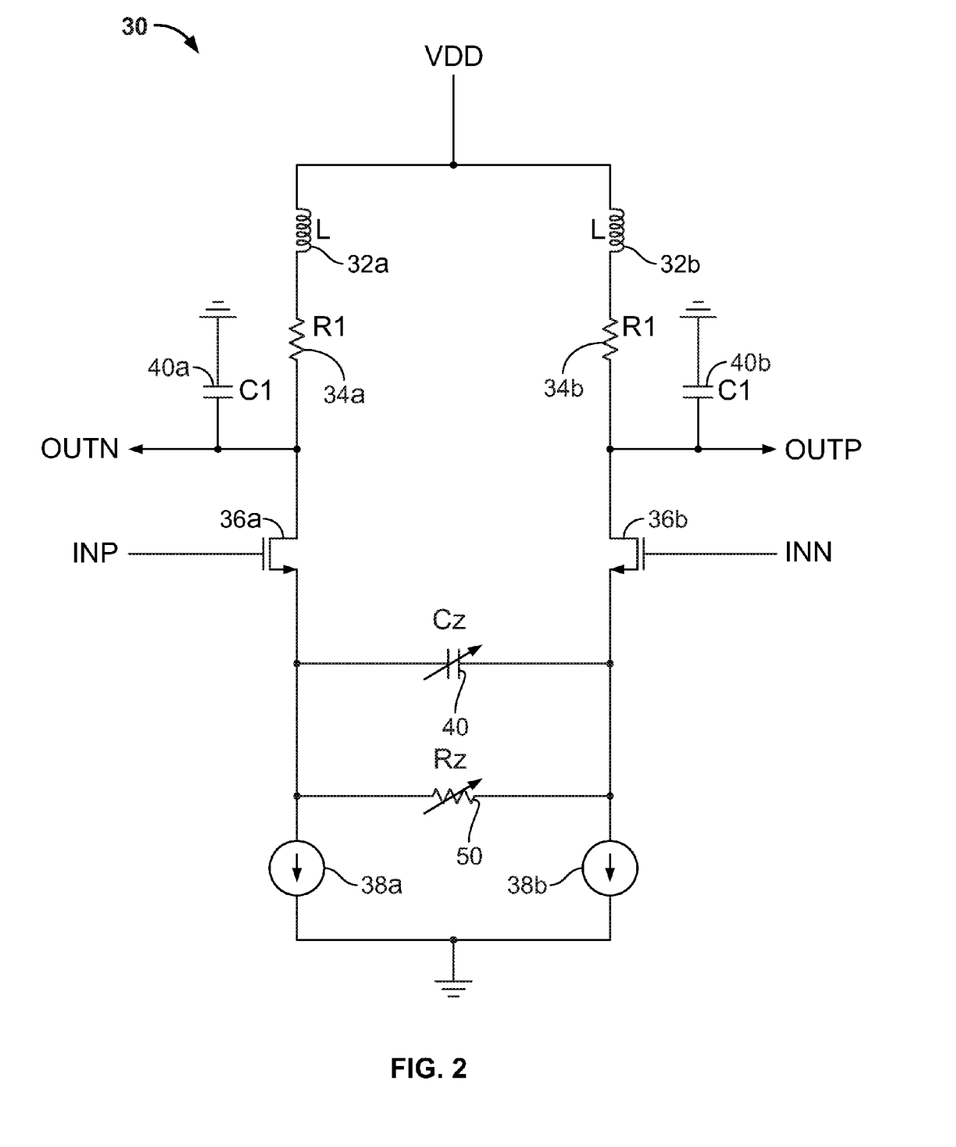
FIG. 2 is a simplified, schematic, block diagram of an illustrative embodiment of a representative portion of the FIG. 1 circuitry in accordance with certain possible features of the invention.

An illustrative embodiment of a receiver equalizer 10 in accordance with this invention is shown in FIG. 1. This is an inductor-based peaking equalizer that can be used, for example, for 20-25 Gigabits-per-second ("Gbps") data signals on a relatively short-range data link. (An illustrative embodiment of one representative continuous time, linear, equalizer ("CTLE") stage 30 with peaking inductors that can be used in equalizer 10 is shown in FIG. 2.) Equalizer 10 can be illustratively implemented in an integrated circuit ("IC") using 28 nanometer ("nm") CMOS technology as part of a high-capacity programmable logic device ("HCPLD") or field-programmable gate array ("FPGA"), although other uses (e.g., in programmable microcontrollers) are also possible. As used herein, the term "complex programmable logic device" ("CPLD") will sometimes be used as a generic term for all of these types of integrated circuits (e.g., HCPLDs, FPGAs, programmable microcontrollers, etc.).

As process technologies scale down, the intrinsic speed (ft) of CMOS transistors moves to higher frequencies. This benefits high-frequency design at lower total power. However, 28 nm CMOS technology is still evolving, so that some process parameters are not yet finalized or are still in development. Also, high gate resistance and high-K metal gate issues may pose additional challenges to the stability of this technology in the short term. Parasitic capacitances and resistances have increased compared to other deep sub-micron technology. These factors increase the design challenges that are faced in trying to provide enough bandwidth to overcome the loading limits.

Traditional peaking inductors manage to get higher bandwidth, but at the price of very large inductor area. This is avoided in the present design by using (for example) a 1 nH inductor having a much smaller area. In particular, a solenoid inductor (as an example) can reduce intra-winding capacitance, thereby enhancing the Q for a given area, while also achieving higher inductance. This may permit a 6-10 times reduction in area compared to traditional spiral inductors. The solenoid inductors thus referred to (and preferred for use in accordance with this invention) are of a type that is per se known. Such an inductor is fully integrated into the IC. It may employ multiple (e.g., three) metal layers, rather than one metal layer, to save area. The turns of the inductor spiral vertically down through the multiple layers used to provide the inductor. It provides high Q, and has as another important advantage a high self-resonance frequency because the coupling between turns is reduced. Thus it is a kind of spiral inductor, but the spiral is vertical, not horizontal or flattened.

As will be described below, equalizer 10 preferably includes voltage offset compensation circuitry to correct process/voltage/temperature ("PVT") mismatch that may occur. Without such offset compensation, PVT mismatch could make equalizer circuitry 10 not an ideal interface between the input data signals applied to the equalizer and the circuitry (e.g., clock and data recovery or "CDR" circuitry) downstream from the equalizer. To address this possible problem, equalizer 10 preferably includes both static calibration offset and continuous mode DC-offset correction with negative feedback. (A generic term that is sometimes used for the downstream circuitry that makes use of the output of equalizer 10 is "utilization circuitry," CDR circuitry being an illustrative example of such utilization circuitry.)

As has already been said, equalizer 10 can be implemented, for example, in 28 nm CMOS technology to provide, for example again, 25 Gbps physical layer implementation. Compared with ten 10 Gbps lanes, only four channels of such 25 Gbps circuitry can meet the IEEE802.3ba specification for 100 Gbps Ethernet with less power consumption and area cost. This receiver equalizer also allows support of backplane applications, which increases the number of possible uses of ICs that include this circuitry.

As shown in FIG. 1, equalizer 10 includes four main blocks. These are termination block 12, equalizer block 14, dynamic (continuous mode) voltage offset compensation block 16, and static voltage offset compensation block 18.

A received serial data signal to be processed by equalizer 10 (and thereafter by downstream utilization circuitry (e.g., CDR circuitry) that is not shown) is applied to termination block 12 in differential from (i.e., as two complementary signals RXP and RXN). Termination block 12 is differential circuitry that includes two resistors 20a and 20b that are connected in series between the leads carrying the RXP and RXN signals. A source of common mode voltage VCM is connected to a node between resistors 20a and 20b.

Figure 3:
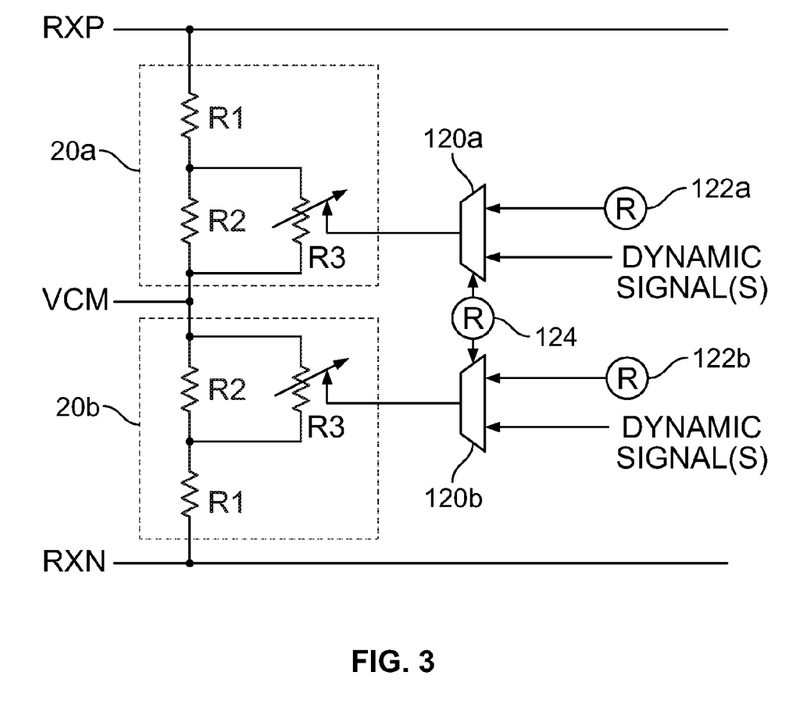
FIG. 3 is a simplified, schematic, block diagram of an illustrative embodiment of another portion of the FIG. 1 circuitry in accordance with certain other possible features of the invention.

A typical objective is for termination block 12 to generate a 100-ohm DC differential impedance. To help ensure that there always is the desired (e.g., 100-ohm) impedance, termination block 12 is preferably tunable. For example, FIG. 3 shows that resistors 20a and 20b may have controllably variable and selectable resistance(s). In particular, FIG. 3 shows that each of resistors 20a and 20b may comprise respective resistors R1, R2, and R3, with resistors R1 and R2 being fixed resistors connected in series with one another, and with resistor R3 being a controllably variable resistor connected in parallel with the associated resistor R2.

The resistance of each resistor R3 is controlled by the output signal(s) of associated multiplexer ("mux") circuitry 120a or 120b. Each mux can select its output(s) from either an associated static (or at least relatively static) signal source 122a or 122b, or alternatively from a more dynamic signal source. The selection made by each mux 120 is determined by the logical state of selection control element 124. For example, if equalizer 10 is implemented on a programmable logic device ("PLD"), a complex PLD ("CPLD"), or other type of programmable integrated circuit device, static sources 122 and 124 may be random access memory ("RAM") bits that are provided on the IC to initially "program" or "configure" (or reprogram or reconfigure) the IC for its desired subsequent "normal mode" or "user mode" operations. In such cases, the more dynamic signals referred to in FIG. 3 may be time-varying signals that occur on the IC during its normal or user mode operations. Although more dynamic than configuration RAM ("CRAM"), these dynamic signals may be stored in non-CRAM memory or registers on the IC. The output signals of each mux 120 may be three binary digits ("bits"), providing three-bit control of the amount of resistance provided by the associated variable resistor R3, and hence the associated resistor 20.

The common mode voltage VCM may also be selectable to meet the requirements of any of several possible applications of the circuitry. For example, VCM may be selected (e.g., by CRAM control) to be 0.7V, 0.65V, or any other desired common mode voltage level.

With regard to tuning termination block 12 as described above, there is a tradeoff between the need to compensate for process variations and a need to avoid undue parasitic capacitance.

Turning now to equalizer block 14, this is a three-stage, differential, analog, linear equalizer with peaking inductors. The three stages are labelled EQ1, EQ2, and EQ3 (or 30a, 30b, and 30c), and they are connected in series in that order. Each stage 30 may be constructed basically as shown in FIG. 2 (although EQ1 and EQ2 preferably have some additional features that will be described after the general discussion of FIG. 2 that follows first). With three stages 30a-c, equalizer block 14 can provide, for example, 9-dB gain at half data rate frequency, and up to 15-dB gain by appropriately tuning the Rz and Cz values in the three stages (see later discussion of FIG. 2). As noted earlier, the equalizer is particularly adapted to compensate distances of less than, e.g., 20 cm link length including connectors and vias. As was also noted earlier, the peaking inductor value may be about 1 nH with a Q of about 5 at the frequencies of interest.

FIG. 2 shows the basic construction of each equalizer stage 30 in FIG. 1. The differential circuitry of each stage 30 is connected between a power supply voltage VDD and ground. The circuitry basically includes two parallel, differential legs, each of which includes a peaking inductor 32a or 32b, a resistor 34a or 34b, source and drain terminals of a transistor 36a or 36b, and a current source 38a or 38b. In each leg, the above circuit elements are connected in series in the order in which they are named above. The input data signal (to be equalized or further equalized) is applied in complementary (differential) form to input terminals INP and INN, which are respectively connected to the gates of transistors 36a and 36b. These complementary signals are either the outputs of termination block 12 or the outputs OUTP and OUTN of the immediately preceding equalizer block 30, depending on which stage of the equalizer is being considered. The equalized data output signal of the equalizer stage is applied in complementary or differential form to output leads OUTN and OUTP, which are connected to nodes between resistors 34 and transistors 36. (Capacitors 40a and 40b (or C1) represent the loading capacitance seen at the output nodes. For example, such loading capacitance may include parasitic loading from the routing, and the device loading that connects to the node (e.g., gate capacitance of the next stage input devices).) Variable capacitor 40 (or Cz) is connected between (1) a node between transistor 36a and current source 38a, and (2) a node between transistor 36b and current source 38b. Variable resistor 50 (or Rz) is connected in parallel with capacitor 40 between immediately above-mentioned nodes (1) and (2).

In order to optimize the equalizer for different environments, equalizer stage 30 provides certain tuning ability. In particular, the capacitor 40 (typically implemented as a varactor) and resistor 50 values (Cz and Rz, respectively) have certain tuning ranges that can be controlled, for example, by the CPLD core (e.g., in cases in which the equalizer is implemented on that type of IC). Such tuning can adjust the pole and zero locations of the equalizer stage to optimize the equalizer curve for various transmission environments. Integrating the equalizer circuitry with CPLD circuitry allows programming or controlling the different tuning settings quickly and at low cost to the user.

Figure 4:
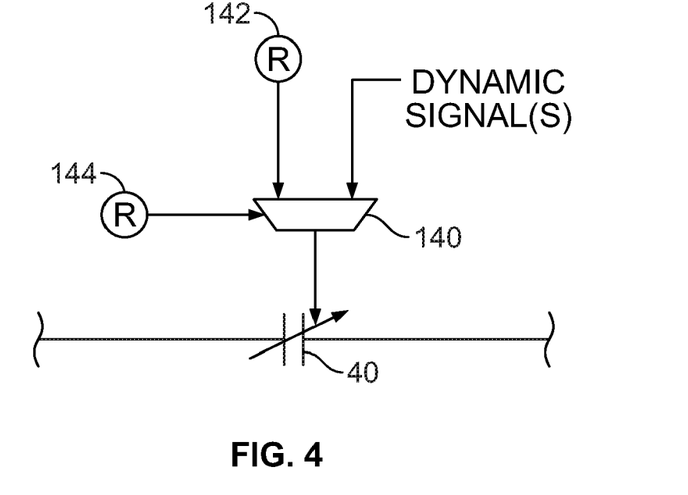
FIG. 4 is a simplified, schematic, block diagram of an illustrative embodiment of a portion of the FIG. 2 circuitry in accordance with certain still other possible features of the invention.
Figure 5:
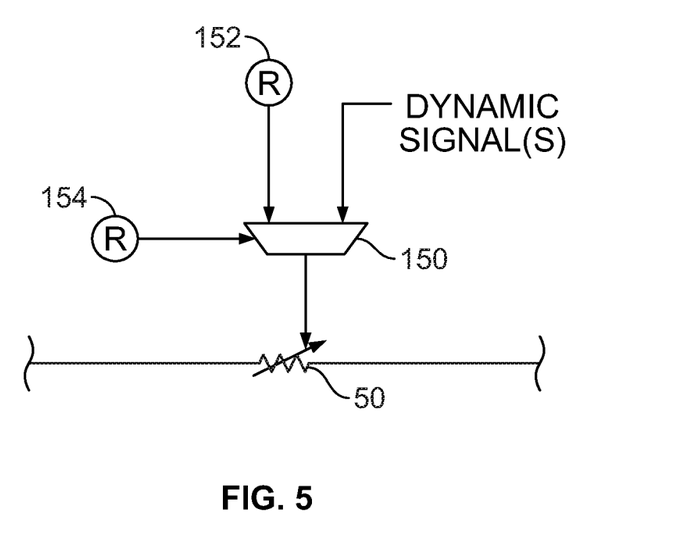
FIG. 5 is similar to FIG. 4 for yet other possible features of the invention.

FIGS. 4 and 5 show examples of how variable capacitor 40 and variable resistor 50 may be controlled (tuned) as described above. The control circuitry shown in FIGS. 4 and 5 is generally of the type shown in FIG. 3. Thus in FIG. 4, the capacitance value Cz of variable capacitor 40 may be controlled by the output(s) of mux 140. Mux 140 selects its outputs from either static or relatively static source 142 (e.g., configuration RAM or CRAM bits) or from more dynamic signals (e.g., user mode signals or user RAM of associated CPLD core circuitry). The selection made by mux 140 is controlled by a selection control signal from source 144 (e.g., another CRAM bit). The circuitry shown in FIG. 5 is similar, with FIG. 5 elements 150, 152, 154, and "dynamic signal(s)" being respectively similar to FIG. 4 elements 140, 142, 144, and "dynamic signal(s)."

Turning now to offset voltage compensation circuits 16 and 18 in FIG. 1, such offset voltage compensation is important to reduce process-variation-caused mismatch (also sometimes referred to as PVT mismatch), especially for geometries below 90 nm technology. The present disclosure preferably includes both static DC mode offset voltage compensation 18 and dynamic continuous mode offset voltage compensation 16. Static compensation 18 calibrates the DC voltage offset from the equalizer output to, for example, the phase detector of downstream CDR circuitry (not shown) during initial power-up of the circuitry (e.g., the CPLD) that includes the equalizer. It provides what may be described as relatively coarse compensation, e.g., up to about 80 mV with about 5 mV resolution. For example, CPLD core circuitry may provide (e.g., store or program) eight bits to calibrate the appropriate static DC mode offset voltage. This static DC mode offset compensation may be actually effected in the second stage 30b of equalizer 14, as will be shown and described in more detail later in this specification.

The continuous mode offset voltage compensation provides relatively fine compensation while the equalizer is in normal operation. This is the circuitry shown at 16 in FIG. 1. This differential circuitry monitors the differential voltage output of equalizer 14 (i.e., the differential voltage of differential signal CDRP/CDRN), and dynamically compensates for any low-frequency or DC offsets. In other words, whereas the offset compensation provided by the earlier-mentioned static DC mode offset compensation circuitry 18 is basically constant after it has been established on the basis of an initial calibration of the IC prior to normal-mode use of the IC, the amount of compensation provided by circuitry 16 can vary over time during the course of normal-mode use of the IC. Moreover, this dynamic variation of the compensating effects of circuitry 16 occurs automatically in response to on-going monitoring of the amount and direction of offset that needs to be corrected (compensated).

Continuous mode offset voltage compensation circuitry 16 includes error amplifier circuit A1 (or 70) and so-called Gm stage 90. Circuit 70 may be a so-called fully differential, folded-cascode, trans-conductance amplifier with common mode feedback ("CMFB"), e.g., of a type that is per se conventional and well known to those skilled in the art. It typically does not have internal tuning. Gm 90 can be a relatively simple differential circuit that converts differential voltage offset error signals output by A1 to proportional differential currents (In and Ip) with low gain. Gm 90 may be programmable (e.g., using CRAM) to provide any of several desired current gains.

Resistors Rc are connected in series between (1) CDRP and CDRN, and (2) the differential inputs to A1. Cp indicates parasitic capacitance seen at these nodes. Such parasitic capacitance typically includes the routing parasitic capacitance and input device gate capacitance. Each capacitor Co is connected between (1) a respective one of the differential outputs of A1, and (2) ground. Ro refers to the output impedance of the error amplifier. The differential outputs of A1 are connected to differential inputs to Gm. Gm produces two, typically dynamically time-varying output currents In and Ip that are used in first equalizer stage 30a as shown more specifically in FIG. 6 and described later.

Rc, Cp, Ro, and Co define the pole positions of dynamic continuous mode offset compensation circuitry 16. The locations of these poles influence the stability of this closed loop feedback offset compensation control. Rc and Co are variable to provide some tunability to compensate for process variations. For example, the circuitry that is used to control the variable capacitance of each of capacitors Co can be constructed similarly to what is shown in FIG. 4 for earlier-described variable capacitors 40. Likewise, the circuitry that is used to control the variable resistance of each of resistors Rc can be constructed similarly to what is shown in FIG. 5 for earlier-described variable resistors 50. Again, Ro is the output impedance of A1, and Cp is the capacitance at A1's inputs.

The bandwidth of dynamic continuous mode offset compensation loop 16 is preferably set at a low frequency (e.g., less than 100 MHz) to avoid interfering with the higher-frequency data path (i.e., from RXP/RXN to CDRP/CDRN).

Figure 6:
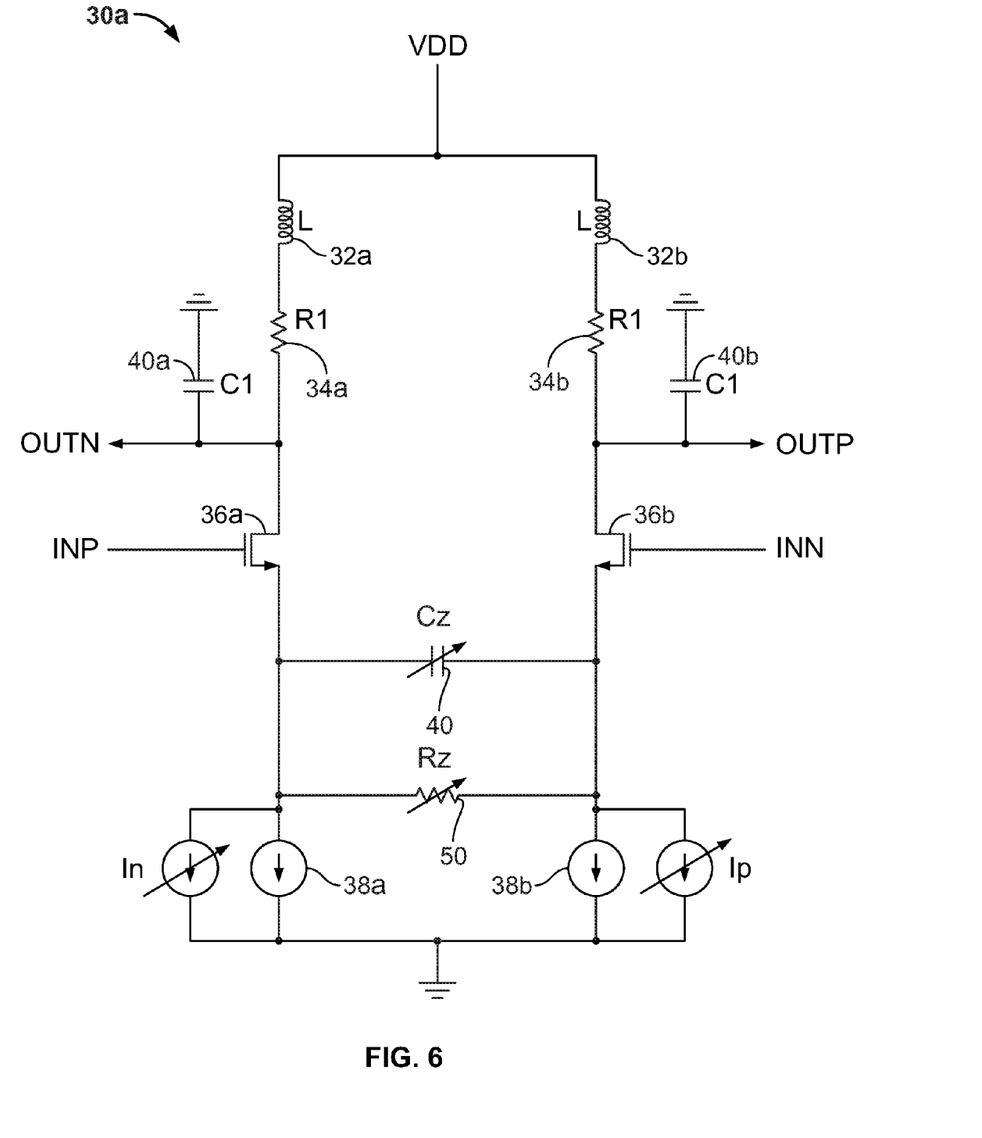
FIG. 6 is similar to FIG. 2, but shows an illustrative embodiment of modification of one instance of the FIG. 2 circuitry in accordance with certain possible aspects of the invention.

FIG. 6 shows how the output current In and Ip of offset compensation circuit 16 may be used in equalizer block 14 to actually produce dynamic continuous mode offset compensation. In particular, FIG. 6 shows that In (output by circuit block 14) is connected in parallel with current source 38a in first-stage equalizer 30a so that In and the current of source 38a algebraically add together. Similarly, FIG. 6 shows that Ip (output by circuit block 14) is connected in parallel with current source 38b in first-stage equalizer 30a so that Ip and the current of source 38b algebraically add together. The offset compensation shown here does not load the high-speed outputs of the equalizer stage. It therefore comes with little penalty to the performance of the equalizer.

Figure 7:
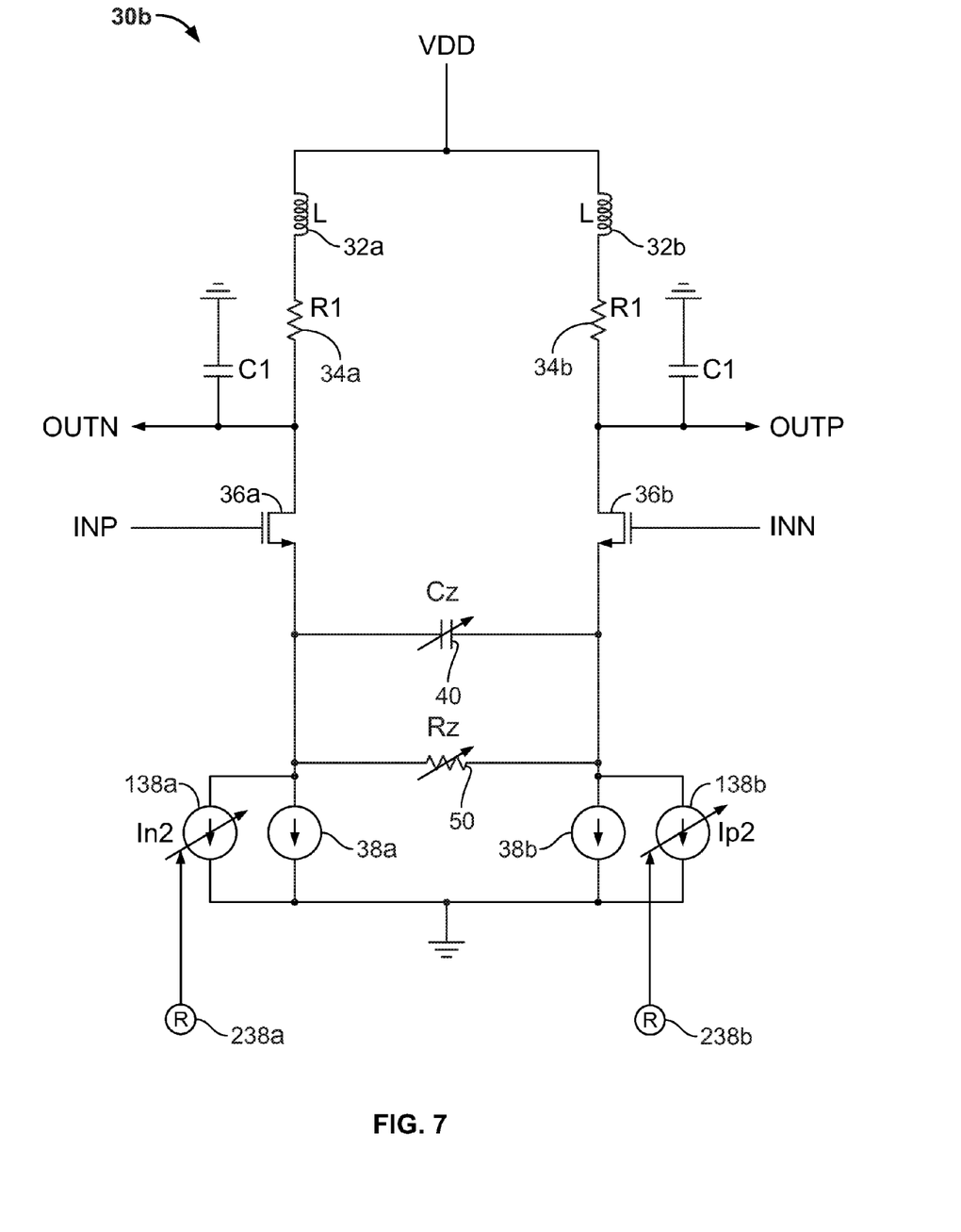
FIG. 7 is similar to FIG. 6 for another instance of the FIG. 2 circuitry in accordance with certain other possible aspects of the invention.

FIG. 7 shows an illustrative embodiment of circuitry that may be used, e.g., in second equalizer stage 30b, to effect static DC mode compensation 18 as described earlier in this specification. In particular, FIG. 7 shows that in second stage 30b variable current source 138a is connected in parallel with current source 38a so that the currents of these sources algebraically add together. Similarly, FIG. 7 shows that second stage variable current source 138b is connected in parallel with second stage current source 38b so that the currents of these two sources algebraically add together. The current In2 produced by variable current source 138a is controlled by memory or registers (RAM bits) 238a. The current Ip2 produced by variable current source 138b is controlled by memory or registers (RAM bits) 238b. Elements 138a/b and 238a/b can constitute the static offset circuitry 18 shown in FIG. 1.

The contents of registers 238a/b are set as part of a static DC mode calibration operation that may take place (as mentioned earlier in this specification) during initial power up of the IC. During this process, there is no high-speed serial data RXP/RXN, first equalizer stage 30a is powered down, dynamic mode compensation block 16 is not operating, and the inputs to second equalizer stage 30b are set to the same common mode voltage. As a result, the second and third stage equalizers (30b and 30c) are both on with input common mode voltage. The offset voltage compensation value needed is detected via test circuitry and converted to appropriate values for storage in registers 238 by appropriate external analysis (e.g., a look-up table that converts the DC voltage offset from equalizer block 14 to the phase detector of downstream CDR circuitry to the RAM bit 238 values needed to eliminate or at least substantially reduce the detected offset).

Registers 238 are loaded with the RAM bit values determined in this way, and thereafter blocks 14 and 16 are allowed to begin normal operation.

By combining the above-described static and dynamic modes, the voltage offset compensation range can be quite large (e.g., up to 130 mV). The minimum compensated offset voltage is limited by error amplifier 70, since it also introduces offset voltage. To minimize the offset voltage, the input differential pairs (at the gates of input transistors of A1 (70)) should be big enough. These input transistor gates are connected to CDRP and CDRN through resistors Rc. The values of Rc are preferably selected to be big enough to minimize the loading penalty to CDRP/CDRN from the A1 input transistors. Thus the values of Rc are a trade-off among stability, area, and equalizer performance. The loop stability is defined by the error amplifier 70 output stage pole and input pole position. The loading capacitor Co should be big enough to keep more than 60 degrees phase margin ("PM") for the PVT. All of the circuits are preferably fully differential to have better common-mode noise rejection.

Briefly recapitulating and in some respects extending the foregoing, at high frequencies equalizer 10 is important to recover the data in the receiver because of the bandwidth limitation. This design is a novel receiver equalizer at frequencies, e.g., of 25 Gbps in, e.g., 28 nm CMOS technology with low power supply of, e.g., 1.0V. With a three-stage analog linear equalizer (instead of, e.g., a decision feedback equalizer ("DFE")), the three-stage equalizer consumes, e.g., about 16.5 mA DC current with an, e.g., 1.0V power supply to open, e.g., 25 Gbps PRBS7 data through an, e.g., 300 mm channel with, e.g., 16 dB of loss at, e.g., 12.5 GHz. With combined static and dynamic offset compensation, it permits operation with longer links up to, e.g., 25 cm without significant calibration and tuning. Integrating the equalizer into an IC such as a CPLD or a high-end field programmable gate array ("FPGA") increases the flexibility of high-speed data links. As mentioned, the equalizer can be fabricated with, e.g., 28 nm CMOS technology running at, e.g., 25 Gbps and integrated into, e.g., an HCPLD. This helps make possible, e.g., 20/25 Gbps backplane applications.

It will be understood that the foregoing is only illustrative of the principles of the invention, and that various modifications can be made by those skilled in the art without departing from the scope and spirit of the invention.

The invention claimed is:

1. Equalizer circuitry on an integrated circuit comprising:
   first, second, and third continuous time, linear, equalizer stages connected in series with one another in order from the first stage through the second stage to the third stage, each of the equalizer stages including peaking inductor circuitry; and
   controllably variable, static, DC mode offset voltage compensation circuitry for controllably reducing DC voltage offset between an output signal of the third stage and utilization circuitry to which that output signal is applied; wherein:
   one of the equalizer stages includes a controllably variable current source; and
   the static, DC mode offset voltage compensation circuitry controls current of the current source, the static, DC mode offset voltage compensation circuitry comprising memory circuitry for loading with values to control the current of the current source.

2. The equalizer circuitry defined in claim 1 wherein:
   the one of the equalizer stages is the second equalizer stage; and
   the static, DC mode offset voltage compensation circuitry operates on the second equalizer stage.

3. The equalizer circuitry defined in claim 1 further comprising:
   dynamic, continuous mode, offset voltage compensation circuitry for reducing continuous mode voltage offset of the output signal.

4. The equalizer circuitry defined in claim 3 wherein the dynamic, continuous mode, offset voltage compensation circuitry operates on the first equalizer stage.

5. The equalizer circuitry defined in claim 4 wherein the first equalizer stage includes a controllably variable current source, and wherein the dynamic, continuous mode, offset voltage compensation circuitry controls current of the current source.

6. The equalizer circuitry defined in claim 5 wherein the dynamic, continuous mode, offset voltage compensation circuitry comprises:
   feedback loop circuitry from the output signal to the current source.

7. The equalizer circuitry defined in claim 6 wherein the feedback loop circuitry comprises:
   error amplifier circuitry for amplifying a voltage offset error in the output signal; and
   voltage-to-current conversion circuitry for converting a voltage offset error signal output by the error amplifier circuitry to a proportional current signal for use by the current source.

8. The equalizer circuitry defined in claim 1 further comprising:
   controllably variable termination circuitry for controllably varying an impedance of an input signal to the first equalizer stage.

9. The equalizer circuitry defined in claim 8 wherein the controllably variable termination circuitry comprises:
   controllably variable resistance circuitry.

10. The equalizer circuitry defined in claim 9 further comprising:
    memory circuitry for controlling resistance of the controllably variable resistance circuitry.

11. The equalizer circuitry defined in claim 1 wherein the utilization circuitry comprises:
    clock and data recovery circuitry.

12. The equalizer circuitry defined in claim 1 wherein at least one of the equalizer stages comprises:
    controllably variable resistor or capacitor circuitry for providing a pole of controllably variable position in frequency response of that equalizer stage.

13. The equalizer circuitry defined in claim 12 further comprising:
    memory circuitry for controlling resistance or capacitance of the controllably variable resistor or capacitor circuitry.

14. The equalizer circuitry defined in claim 1 wherein at least one of the equalizer stages comprises differential circuitry.

15. The equalizer circuitry defined in claim 1 wherein the static, DC mode offset voltage compensation circuitry comprises differential circuitry.

16. The equalizer circuitry defined in claim 1 wherein the integrated circuit is a complex programmable logic device.

17. The equalizer circuitry defined in claim 1 wherein the equalizer circuitry is adapted for processing a high-speed special data signal having a bit rate of 20-25 Gbps.

18. The equalizer circuitry defined in claim 1 wherein the integrated circuit is fabricated using 28 nm CMOS fabrication technology.

19. Equalizer circuitry on an integrated circuit comprising:
first, second, and third continuous time, linear, equalizer stages connected in series with one another in order from the first stage through the second stage to the third stage, each of the equalizer stages including peaking inductor circuitry; and
dynamic, continuous mode, offset voltage compensation circuitry for monitoring an output signal of the third stage and continuously reducing voltage offset between the output signal of the third stage and utilization circuitry to which that output signal is applied.

20. The equalizer circuitry defined in claim 19 wherein the dynamic, continuous mode, offset voltage compensation circuitry operates on the first equalizer stage.

21. The equalizer circuitry defined in claim 20 wherein the first equalizer stage includes a controllably variable current source, and wherein the dynamic, continuous mode, offset voltage compensation circuitry controls current of the current source.

22. The equalizer circuitry defined in claim 21 wherein the dynamic, continuous mode, offset voltage compensation circuitry comprises:
feedback loop circuitry from the output signal to the current source.

23. The equalizer circuitry defined in claim 22 wherein the feedback loop circuitry comprises:
error amplifier circuitry for amplifying a voltage offset error in the output signal; and
voltage-to-current conversion circuitry for converting a voltage offset error signal output by the error amplifier circuitry to a proportional current signal for use by the current source.

24. The equalizer circuitry defined in claim 19 further comprising:
controllably variable termination circuitry for controllably varying an impedance of an input signal to the first equalizer stage.

25. The equalizer circuitry defined in claim 24 wherein the controllably variable termination circuitry comprises:
controllably variable resistance circuitry.

26. The equalizer circuitry defined in claim 25 further comprising:
memory circuitry for controlling resistance of the controllably variable resistance circuitry.

27. The equalizer circuitry defined in claim 19 wherein the utilization circuitry comprises:
clock and data recovery circuitry.

28. The equalizer circuitry defined in claim 19 wherein at least one of the equalizer stages comprises:
controllably variable resistor or capacitor circuitry for providing a pole of controllably variable position in frequency response of that equalizer stage.

29. The equalizer circuitry defined in claim 28 further comprising:
memory circuitry for controlling resistance or capacitance of the controllably variable resistor or capacitor circuitry.

30. The equalizer circuitry defined in claim 19 wherein at least one of the equalizer stages comprises differential circuitry.

31. The equalizer circuitry defined in claim 19 wherein the dynamic, continuous mode, offset voltage compensation circuitry comprises differential circuitry.

32. Equalizer circuitry on an integrated circuit comprising:
first, second, and third continuous time, linear, differential, equalizer stages connected in series with one another in order from the first stage through the second stage to the third stage, each of the equalizer stages including peaking inductors; and
dynamic, continuous mode, differential, offset voltage compensation circuitry for monitoring differential output signals of the third stage and continuously reducing voltage offset between the differential output signals of the third stage and utilization circuitry to which those differential output signals are applied.

* * * * *